United States Patent [19]

Takahashi

[11] Patent Number: 4,912,533
[45] Date of Patent: Mar. 27, 1990

[54] END FACE LIGHT EMITTING ELEMENT

[75] Inventor: Shogo Takahashi, Hyogo, Japan

[73] Assignee: Mitsubishi Denki Kabushiki Kaisha, Tokyo, Japan

[21] Appl. No.: 106,461

[22] Filed: Oct. 9, 1987

[30] Foreign Application Priority Data

Oct. 9, 1986 [JP] Japan .................. 61-241680

[51] Int. Cl.⁴ .............................................. H01L 33/00
[52] U.S. Cl. ........................................ 357/17; 357/16; 357/56; 357/55; 357/19; 333/249
[58] Field of Search .................... 357/17, 16, 19, 55, 357/56, 30 E; 333/247, 249, 248

[56] References Cited

U.S. PATENT DOCUMENTS

| | | | |
|---|---|---|---|
| 3,484,713 | 12/1969 | Fenner | 357/19 X |
| 4,284,884 | 8/1981 | Dyment et al. | 357/19 X |
| 4,365,336 | 12/1982 | Sugino et al. | 357/17 X |
| 4,692,207 | 9/1987 | Bouadma et al. | 357/19 X |
| 4,438,446 | 3/1984 | Tsang | 357/17 |
| 4,464,762 | 8/1984 | Furuya | 357/17 X |
| 4,476,563 | 10/1984 | Van Ruyven | 357/17 X |
| 4,488,306 | 12/1984 | Sugino et al. | 357/17 X |
| 4,506,366 | 3/1985 | Chinone et al. | 357/17 X |
| 4,571,729 | 2/1986 | Fujimoto | 357/17 X |
| 4,602,370 | 7/1986 | Tsang | 357/17 X |
| 4,605,942 | 8/1986 | Camlibel | 357/17 |
| 4,730,330 | 3/1988 | Plihal et al. | 357/19 X |

FOREIGN PATENT DOCUMENTS

| | | | |
|---|---|---|---|
| 58-102589 | 6/1983 | Japan | 357/17 X |
| 60-182779 | 9/1985 | Japan | 357/19 X |

OTHER PUBLICATIONS

"High Radiance Light Emitting Diode as the Source for Optical Transmission Lines", by Yoshiji Horikoshi and Yasuo Seki, Research and Practical Report, vol. 24, No. 9, 1975, pp. 57-74.

"A Challenge to Laser Diodes Long-Wavelength LEDS:", by Gregory H. Olsen, Photonics Spectra, Sep., 1985.

"Promising New Fabrication Process Developed for Stacked LSI's", by M. Yasumoto, H. Hayama and T. Enomoto, IDEM, 1984, pp. 816-819.

Primary Examiner—William Mintel
Attorney, Agent, or Firm—Sughrue, Mion, Zinn, Macpeak & Seas

[57] ABSTRACT

An end face light emitting element having a light emitting region on a semiconductor substrate to emit light from the end face thereof has a light waveguide layer between the light emitting region and the substrate with the light emitting region deformed like a staircase having at least two steps.

6 Claims, 2 Drawing Sheets

END FACE LIGHT EMITTING ELEMENT

BACKGROUND OF THE INVENTION

This invention relates to an end face light emitting element, more particular to a figure of an end face light emitting LED.

An example of a conventional end face light emitting LED, as shown in FIG. 2, comprises: an InP substrate 1; an n-type InP clad layer 2; a p-type InGaAsP active layer 3; a p-type InP clad layer 4; a p-type InGaAsP cap layer 5; an insulating film 6; and a metal electrode 7. The components 2 through 7 form a light emitting region. In the end face light emitting element thus constructed, current inputted through the metal electrode 7 is outputted as a light output 8 from the end face of the light emitting element through the recombination in the active layer 3.

In the conventional end face light emitting element, because of the loss or generation of heat due to absorption of light in the active layer 3, the length of the light emitting region and the value of current to be applied are limited; that is, increase of the output is limited.

SUMMARY OF THE INVENTION

In view of the foregoing, an object of this invention is to provide an end face light emitting element which is high in output power and can be coupled to optical fibers with high efficiency.

The foregoing object and other objects of the invention have been achieved by the provision of an end face light emitting element in which a light emitting region is provided on the major surface of a semiconductor substrate and light is emitted from the end face of the light emitting region, which comprises: a light waveguide layer provided between the light emitting region and the semiconductor substrate with the light emitting region being in the form of a staircase having at least two steps.

An end face light emitting element of the invention is able to provide light output equivalent to that provided by the device which is formed by piling at least two conventional end face light emitting elements.

The nature, principle and utility of the invention will become more apparent from the following detailed description when read in conjunction with the accompanying drawings.

DETAILED DESCRIPTION OF THE PREFERRED EMBODIMENT

On example of an end face light emitting element according to the invention will be described with reference to FIG. 1.

In the end face light emitting element of the invention, its light emitting region is in the form of a staircase with the upper and lower steps 9 and 10.

Figure 1:
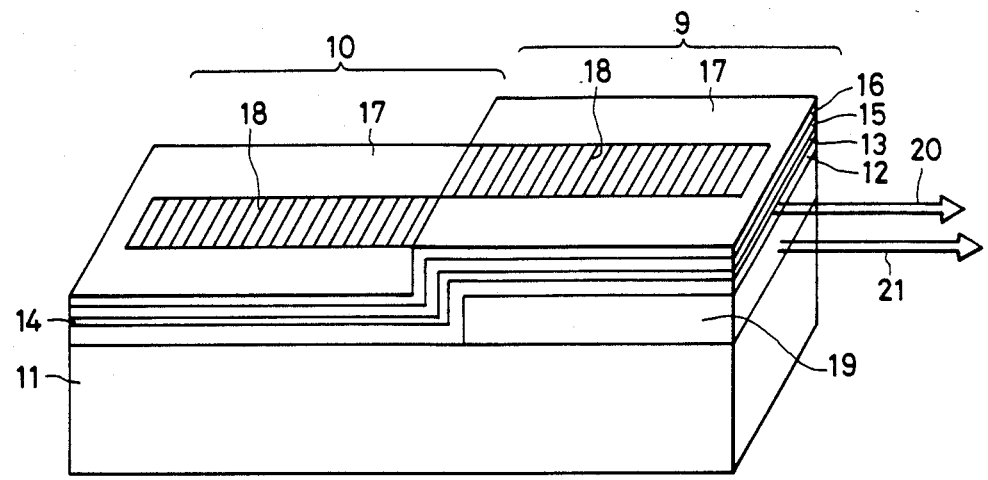
FIG. 1 is a perspective view showing the structure of an example of an end face light emitting element according to this invention.
Figure 2:
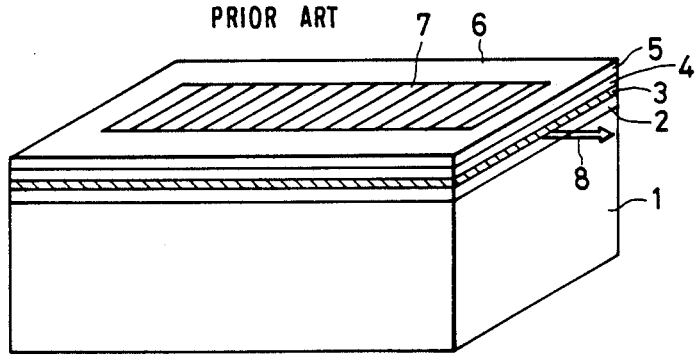
FIG. 2 is a perspective view showing the structure of an example of a conventional end face light emitting element.

The end face light emitting element, as shown in FIG. 1, comprises: an InP substrate 11, an n-type InP clad layer 12; a p-type InGaAsP active layer 13 forming the step 9; a p-type InGaAsP active layer 14 forming the step 10; an p-type InP clad layer 15; a p-type InGaAsP cap layer 16; an insulating film 17; a metal electrode 18; and an n-type InGaAsP light waveguide layer 19. Further in FIG. 1, reference numeral 20 designates a light output from the active layer 13 of the step 9; and 21, a light output from the active layer 14 of the step 10. In the end face light emitting element, the band gap of the light waveguide layer 19 is larger than that of the active layer 13.

A method of forming the light emitting region will be described.

A light waveguide layer is formed on the InP substrate 11 by crystal growth. A half of the light waveguide layer thus formed, which is located behind the light emitting end face (on the right side of FIG. 1), i.e., the left half of the light waveguide layer is removed by etching and the light waveguide layer 19 constituting the step 9 remains on the substrate 11 to form a stepped structure with the substrate 11 and the light waveguide layer 19. The n-type InP clad layer 12, the p-type InGaAsp active layer 13(14), the p-type InP clad layer 15 and the cap layer 16 are formed on the stepped structure by crystal growth in the stated order. Thus, the aforementioned light emitting region consisting of the upper and lower steps has been formed.

An end face light emitting element formed according to the invention has at least two vertically stepped light emitting regions, so that its light output is equivalent to that provided by a device which is formed by piling at least two end face light emitting elements. Furthermore, in the end face light emitting element of the invention, the light emitting end faces are flush with one another and very close to one another in a vertical direction. Therefore, the end face light emitting element of the invention can be coupled to optical fibers with high efficiency.

Referring back to FIG. 1, the light output 21 from the active layer 14 of the step 10 is obtained through the light waveguide layer 19, and the light output 20 from the active layer 13 of the step 9 is obtained at the end face of the light emitting region.

In the above-described embodiment, the light emitting region is in the form of a staircase having two steps; however, the invention is not limited thereto or thereby. That is, the light output can be increased by increasing the number of steps to form the light emitting region.

In the above-described embodiment, materials of InP series are employed. However, the same effects can be obtained by using other materials such as those of GaAs series.

As described above, in the end face light emitting element of the invention, the light emitting region is in the form of a staircase having at least two steps, and therefore its light output is equivalent to that provided by the device which is formed by piling at least two end face light emitting elements. Therefore, a high power end face light emitting element can be provided according to the invention.

Furthermore, if the light emitting end faces are provided in such a manner that they are flush with one another and adjacent to one another, the end face light emitting element can be coupled to optical fibers with high efficiency.

What is claimed is:

1. An end face light emitting element, comprising:

a semiconductor substrate, the major surface of said substrate having a first portion and a second portion which is different from the first portion;

a light waveguide layer only formed on the first portion of the major surface of said semiconductor substrate; and a light emitting region formed on the second portion of the major surface of said semiconductor substrate and formed on said light waveguide layer so that said light emitting region forms a staircase configuration having at least two steps and so that said light waveguide layer and said light emitting region are light emitting at an end face of the end face light emitting element.

2. The end face light emitting element according to claim 1, wherein the end face of said light emitting element is adapted to output light beams from said at least two steps, the outputted light beams being adjacent to one another.

3. The end face light emitting element according to claim 1, wherein the surface of said light waveguide layer is substantially planar, and wherein said light emitting region forms a staircase configuration having two steps.

4. The end face light emitting element according to claim 1, wherein said light emitting region comprises: a first clad layer of a first conductivity type formed on said light waveguide layer and on the second portion of said semiconductor substrate; an active layer of a second conductivity type formed on said first clad layer; and a second clad layer of the second conductivity type formed on said active layer.

5. The end face light emitting element according to claim 4, wherein said light emitting region further comprises a cap layer of the second conductivity type formed on said second clad layer.

6. The end face light emitting element according to claim 5, further including an electrode formed on the surface of said cap layer and an insulating film formed on that portion of the surface of said cap layer not including the electrode.

* * * * *